United States Patent
Shearon et al.

(10) Patent No.: US 8,836,352 B2
(45) Date of Patent: Sep. 16, 2014

(54) SYSTEM AND METHOD FOR USING AN INTEGRATED CIRCUIT PIN AS BOTH A CURRENT LIMITING INPUT AND AN OPEN-DRAIN OUTPUT

(75) Inventors: William Brandes Shearon, Colorado Springs, CO (US); Lawrence Gilbert Gough, Palm Bay, FL (US)

(73) Assignee: Intersil Americas Inc., Milpitas, CA (US)

( * ) Notice: Subject to any disclaimer, the term of this patent is extended or adjusted under 35 U.S.C. 154(b) by 637 days.

(21) Appl. No.: 12/482,527

(22) Filed: Jun. 11, 2009

(65) Prior Publication Data

US 2010/0259279 A1    Oct. 14, 2010

Related U.S. Application Data

(60) Provisional application No. 61/167,770, filed on Apr. 8, 2009.

(51) Int. Cl.
*G01R 27/08* (2006.01)

(52) U.S. Cl.
USPC ............... 324/713; 324/750.3; 324/762.03; 324/627

(58) Field of Classification Search
USPC ............ 324/713, 750.3, 762.01–762.09
See application file for complete search history.

(56) References Cited

U.S. PATENT DOCUMENTS

| | | | |
|---|---|---|---|
| 5,508,836 A | 4/1996 | DeCaro | |
| 6,608,744 B1 | 8/2003 | Kato | |
| 6,727,721 B2 * | 4/2004 | Altrichter et al. | 324/750.3 |
| 7,420,791 B1 | 9/2008 | Dong et al. | |
| 2008/0252307 A1 * | 10/2008 | Schindler | 324/713 |

FOREIGN PATENT DOCUMENTS

| | | |
|---|---|---|
| CN | 1800861 | 7/2006 |
| JP | 2006-170994 A | 6/2006 |

OTHER PUBLICATIONS

Texas Instrument—TSP2149, TSP2159—SLVS401—Aug. 2001.*
Maxim—USB Current—Limited Switch in Pin-Compatible Package—MAX1607—191544; Rev 2; 09/07.*
Maxim—Application Note 746—Nov 19, 2001.*
K. Lynn et al. "Universal Serial Bus (USB) Power Management," In: WESCON/97; Conference Proceedings; 1997; pp. 434-441.
International Search Report of PCT/US2010/025911; Oct. 13, 2010, 3 pages.
Written Opinion of the International Searching Authority of PCT/US2010/025911; Oct. 11, 2010, 4 pages.
Chinese Patent Office, "Office Action", "from Foreign Counterpart of U.S. Appl. No. 12/482,527", Jun. 20, 2013, pp. 1-19, Published in: CN.
The State Intellectual Property Office of the People's Republic of China, "Second Office Action", "from Foreign Counterpart of U.S. Appl. No. 12/482,527", Nov. 8, 2013, pp. 1-8, Published in: CN.

* cited by examiner

*Primary Examiner* — Arleen M Vazquez
*Assistant Examiner* — Son Le
(74) *Attorney, Agent, or Firm* — Fogg & Powers LLC

(57) ABSTRACT

An integrated circuit comprises at least one pin and has at least one resistor connected between a reference voltage and the at least one pin. Current measurement circuitry applies a voltage across the at least one resistor and measures a current at the at least one pin responsive to the applied voltage in a first mode of operation. The measured current enables determination of a current limit set point for the integrated circuit. In a second mode of operation, the at least one resistor comprises a pull up resistor and the at least one pin that is connected to the at least one resistor comprises an open-drain output.

20 Claims, 4 Drawing Sheets

SYSTEM AND METHOD FOR USING AN INTEGRATED CIRCUIT PIN AS BOTH A CURRENT LIMITING INPUT AND AN OPEN-DRAIN OUTPUT

CROSS-REFERENCE TO RELATED APPLICATIONS

This application claims priority from U.S. Provisional Patent Application No. 61/167,770, filed on Apr. 8, 2009, entitled APPARATUS FOR MULTIPLEXING A CURRENT LIMITING INPUT TO AN OPEN DRAIN OUTPUT which is incorporated herein by reference.

BRIEF DESCRIPTION OF THE DRAWINGS

For a more complete understanding, reference is now made to the following description taken in conjunction with the accompanying Drawings in which.

DETAILED DESCRIPTION

Figure 1:
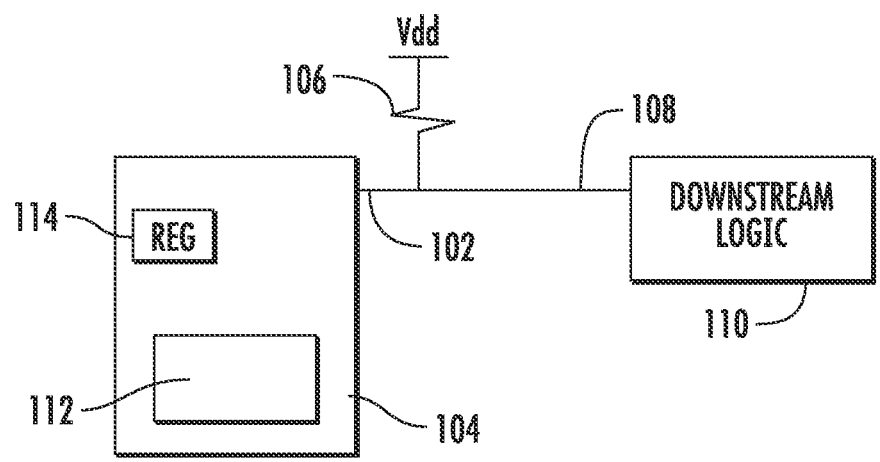
FIG. 1 is a block diagram for the manner for utilizing an output pin of an integrated circuit for a current limiting input and an open-drain output.

Referring now to the drawings, wherein like reference numbers are used herein to designate like elements throughout, the various views and embodiments of a system and method for using an integrated circuit pin as both a current limiting input and an open-drain output are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to the drawings, and more particularly to FIG. 1, there is illustrated a block diagram of a circuit for using a pin of an integrated circuit as both a current limiting input and an open-drain output. Most low voltage current limited power switches such as USB power switches are assembled in low cost, low pin count packages. The implementation illustrated in FIG. 1 combines two common power switch functions into a single pin 102. These functions include a current limit setting input and a fault output. A standard 8-pin pinout integrated circuit 104 includes an application resistor 106 connected between the $V_{DD}$ supply (where $V_{DD}=V_{IN}$) to the integrated circuit 104 and the fault output pin 102. The fault output pin 102 is also connected to a high impedance input 108 of some type of downstream circuit logic 110. The value of the resistor 106 is selected such that when the integrated circuit 104 applies a small voltage across the resistor 106, the resulting current through the resistor is measured by the integrated circuit 104 and then multiplied by a predetermined value to determine the current limiting set point of the integrated circuit 104 using current measurement logic 112. The resistor 106 is read just one time during system start up and once the circuit 104 is turned on, the switch is enabled. The current read by the integrated circuit 104 is stored within an associated memory register 114 for use as the current limiting set point.

For a small voltage, 0.6 volts is chosen such that $V_{DD}$–0.6 volts is still above the voltage threshold for the downstream logic 110 that is connected with the integrated circuit 104. This prevents a fault misread during resistor value reading. Once the current limiting set point has been established by the integrated circuit 104, the resistor 106 may be used with the output pin 102 as an open-drain output to the downstream logic 110. This provides a valuable feature to a standard pinout package. The ability to alter the current limiting set point by altering resistor 106 is of a very high value since this is a primary specification feature for parts of this type. This enables a user to program current limiting to their particular system needs. Thus, using this configuration enables a current limiting resistor to initially be used for establishing a current limit for the integrated circuit 104 and after start up enables the resistor to operate as an open-drain output pull-up. This provides a valuable function to be added to the industry standard 8-pin pinout that has a backward compatible upgrade path.

Figure 2:
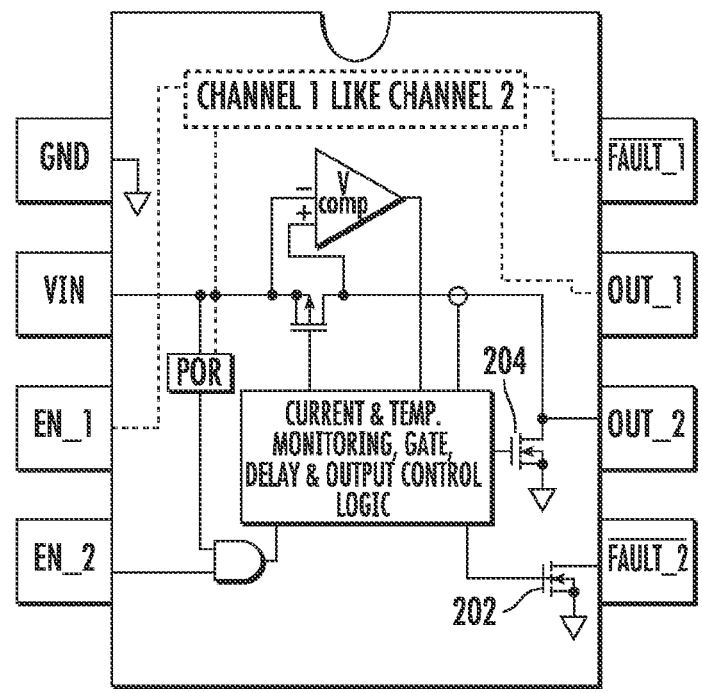
FIG. 2 is a block diagram of a USB port power supply controller in which the circuit of FIG. 1 could be implemented.
Figure 3:
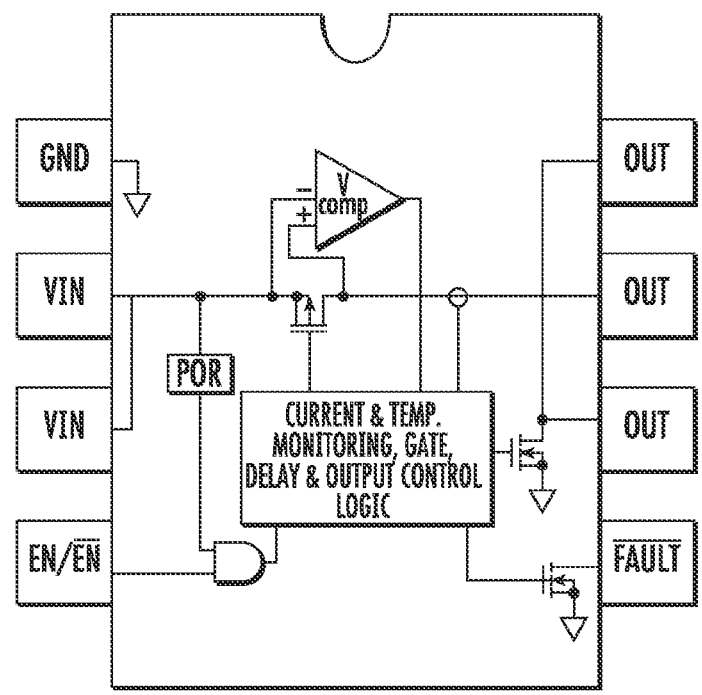
FIG. 3 is a block diagram of an integrated switch hot swap controller in which the circuit of FIG. 1 could be implemented.

Referring now to FIGS. 2 and 3, there are illustrated two examples of packages in which the circuitry of FIG. 1 could be used. Most low current voltage current limiting power switches like a USB power switch are implemented in low cost, low pinout packages. The package of FIG. 2 includes a standard 8-pin pinout configuration. The GND pin provides an IC reference connection to ground. The VIN pin provides a chip bias voltage that comprises a controlled supply input. The chip bias voltage is provided from the VIN pin. At VIN less than 2.5 volts the chip is functionally disabled and the fault latches associated with the $\overline{FAULT\_1}$ and $\overline{FAULT\_2}$ pins are cleared and floating. Additionally, the OUT_1 and OUT_2 pins are held low. The ENABLE_1 and ENABLE_2 pins comprise the channel enable input for enabling and disabling the switch.

The $\overline{FAULT\_1}$ and $\overline{FAULT\_2}$ pins comprise the channel over current fault NOT indicators. The value of the pull up resistors 106 described with respect to FIG. 1 that are attached to each of these pins determine the current limiting level for each switch 202 independently. The over current fault indicator provided from each of these pins floats and is disabled until the voltage applied at VIN is greater than 2.2 volts. This output is pulled low after the over current time-out period has expired and always stays latched until the enable signal applied to the enable pin of the associated channel is deasserted. The OUT_1 and OUT_2 pins comprise the channel voltage outputs which are connected to the load being protected. Upon an over current condition from the OUT pin, $I_{OUT}$ is current limited to a minimum of 0.7 or 1.1 amps. Current limit response time is within 200 microseconds. This output will remain in current limit for a nominal 12 milliseconds before being turned off either for the latch or auto retry versions. The circuit provides sensing in the MOSFET 204 that allows for rapid control of over current events. Once an over current condition is detected, the circuit goes into the current regulation control mode.

The current limit is set by the value of the open-drain pull up resistor 106 and is limited to a 4 amp maximum. Upon initial bias, the resistor value is read and the current limit level is determined and stored. The device provides a fully independent dual channel over current fault protection circuit. Each channel incorporates N-channel or P-channel MOSFET power switches 204 for power control. An N-channel MOS- FET is shown here. Independent enabling input and fault reporting output compatible with 2.5 volt to 5 volt logic enable external control and monitoring.

Referring now also to FIG. 3, there is illustrated an alternative package in which the circuitry of FIG. 1 may be utilized. While the internal circuitry of the packaging is different, the external resistor 106 is able to set the limit current on one of the OUT pins in a similar manner described previously with respect to FIG. 2. The configuration of FIG. 3 includes a single output FAULT pin to which the resistor would be connected rather than the dual channel mode described earlier with respect to FIG. 2. However, the operation of the circuitry of FIG. 1 with respect to the FAULT output pins of the circuit is the same as that discussed above.

Figure 4:
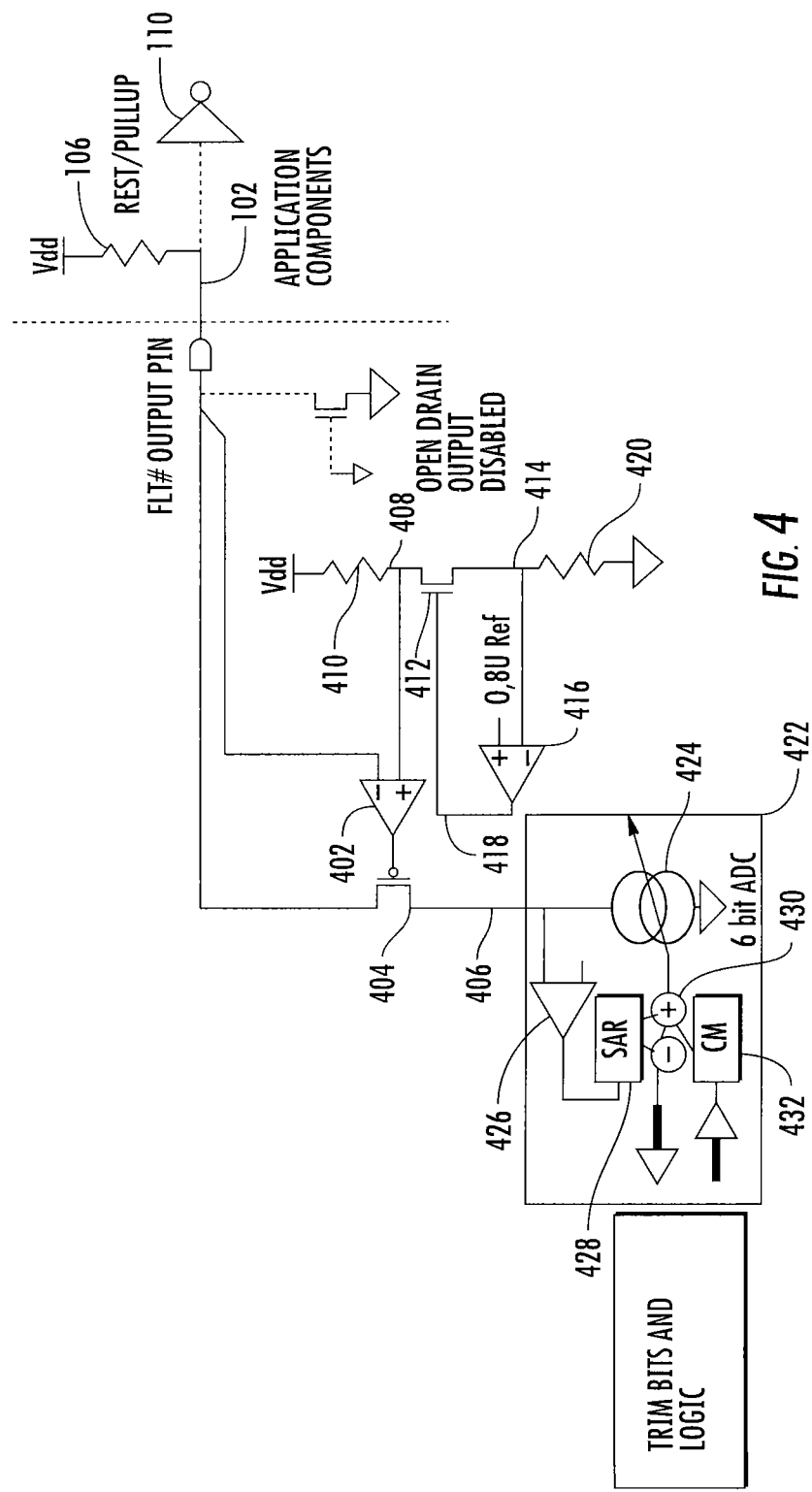
FIG. 4 illustrates an embodiment for monitoring the current limiting input of the circuit of FIG. 1.

Referring now to FIG. 4, there is illustrated one embodiment of the resistor reader circuitry/current measurement logic within the integrated circuit 104 described with respect to FIG. 1 for determining the value of the current limiting resistor 106 at the fault output pin 102. The output pin 102 is connected to the inverting input of an amplifier 402. A transistor 404 has its gate connected to the output of amplifier 402. The drain/source path of the transistor 404 is connected between fault pin 102 and node 406. The non-inverting input of amplifier 402 is connected to node 408. A resistor 410 is connected between $V_{DD}$ and node 408. A transistor 412 has its drain/source path connected between node 408 and node 414. The gate of transistor 412 is connected to the output of amplifier 416 at node 418. The inverting input of amplifier 416 is connected to node 414, and the non-inverting input of amplifier 416 is connected to receive a reference voltage signal. A resistor 420 is connected between node 414 and ground. An N-bit analog-to-digital converter (ADC) 422 is connected to node 406. The N-bit ADC 422 consists of a variable current source 424 connected between node 406 and ground. A comparator 426 has its input connected to node 406 and its output connected to a successive approximation register 428. The other input of comparator 426 may be anywhere with in the swing range of the rail to rail voltage. Node 406 has a fixed current pouring into the top and a fixed current drawn from the bottom and thus comprises a very high impedance node. The output of the successive approximation register 428 is connected to an adder circuit 430 connected with a calibration circuit 432.

At start up, when the fault pin 102 is at a logical "high" level, the analog-to-digital converter 422 scans the value of the pull up resistor 106 without pulling the fault pin 102 below the threshold voltage of the next logic stage 110. The reset/pull up resistor 106 is selected to be precise in the range of 10 k to 300 k ohms. The pull up supply $V_{DD}$ must also comprise the chip supply. This feature is transparent to standard stock and requires no PCB changes from a resistor BOM change.

Figure 5:
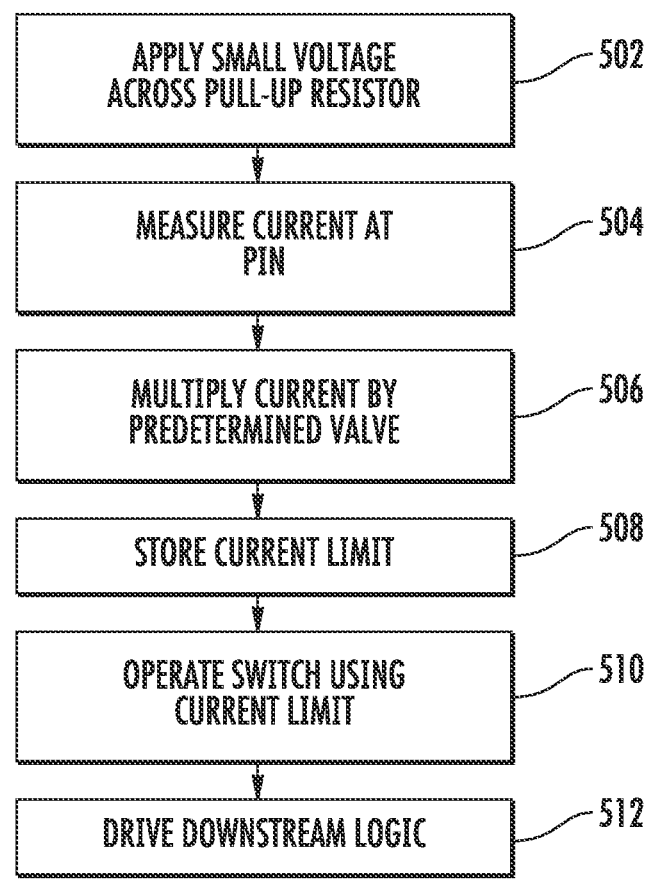
FIG. 5 is a flow diagram describing the operation of the circuit of FIG. 1.

Referring now to FIG. 5, there is illustrated a flow diagram generally describing the operation of the circuitry of FIG. 1. Initially, at step 502 a small voltage is applied by the integrated circuit 104 to the resistor 106 through the output pin 102. Responsive to the voltage across the pull-up resistor 106, the current at the pin 102 is measured at step 504. This measured current is multiplied at step 506 by a predetermined value to generate the set current limit for the integrated circuit 104. This current limit value is stored at step 508 within an associated register within the integrated circuit 104. The switch is then operated within the integrated circuit using the established current limit at step 510. The pin 102 and associated pull up resistor 106 may then be used as an open-drain driver to drive downstream logic at step 512.

It will be appreciated by those skilled in the art having the benefit of this disclosure that this system and method for using an integrated circuit pin as both a current limiting input and an open-drain output provides multiple pin options for limited pin packages. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. An integrated circuit, comprising:
   An integrated circuit, comprising:
   an output pin; and
   current measurement circuitry for applying a predetermined voltage from within the integrated circuit and through the output pin, and measuring a current through the output pin responsive to the predetermined voltage in a start-up mode of operation, wherein the current enables setting of a current limit setpoint for the integrated circuit; and
   wherein in a second mode of operation the output pin comprises an open drain output, the current measurement circuitry including:
   a first amplifier circuit coupled to a reference voltage and generating the predetermined voltage in response to the reference voltage; and
   a second amplifier circuit coupled to the output pin and the first amplifier circuit and generating the current through the output pin by forcing a voltage on the output pin to be substantially equal with the predetermined voltage.

2. The integrated circuit of claim 1, wherein the current measurement circuitry further multiplies the current by a preselected value to set the current limit setpoint for the integrated circuit.

3. The integrated circuit of claim 2, further including a memory register for storing the set current limit setpoint for the integrated circuit.

4. The integrated circuit of claim 1, wherein the output pin comprises a fault pin of the integrated circuit.

5. The integrated circuit of claim 1, wherein the current measurement circuitry maintains the predetermined voltage through the output pin at or above a predetermined threshold voltage level.

6. The integrated circuit of claim 1, wherein the current measurement circuitry further includes an analog to digital converter for measuring the current through the output pin.

7. A USB power switch, comprising:
   an eight pin pin-out package, wherein at least one of the eight pins comprises a fault pin;
   current measurement circuitry for applying a predetermined voltage from within the eight pin pin-out package and through the fault pin, and measuring a current through the fault pin responsive to the predetermined voltage in a start-up mode of operation, wherein the current enables setting of a current limit setpoint for the USB power switch; and
   wherein upon completion of the start-up mode of operation, the fault pin operates as an open drain output, the current measurement circuitry including:
   a first amplifier circuit coupled to a reference voltage and generating the predetermined voltage in response to the reference voltage; and a second amplifier circuit coupled to the fault pin and the first amplifier circuit and generating the current through the fault pin by forcing a voltage on the fault pin to be substantially equal with the predetermined voltage.

8. The USB power switch of claim 7, wherein the current measurement circuitry further multiplies the current by a preselected value to set the current limit setpoint for the USB power switch.

9. The USB power switch of claim 8, further including a register for storing the set current limit setpoint for the USB power switch.

10. The USB power switch of claim 7, wherein the current measurement circuitry maintains the predetermined voltage through the fault pin at or above a predetermined threshold voltage level.

11. The USB power switch of claim 7, wherein the current measurement circuitry further includes an analog to digital converter for measuring the current through the fault pin.

12. A method for multiplexing uses of an output pin of an integrated circuit, comprising the steps of:
a first amplifier circuit within the integrated circuit generating a predetermined voltage responsive to a reference voltage in a first mode of operation;
a second amplifier circuit within the integrated circuit generating a current from within the integrated circuit and through the output pin by forcing a voltage on the output pin to be substantially equal with the predetermined voltage in the first mode of operation;
measuring the current through the output pin responsive to the predetermined voltage in the first mode of operation;
establishing a current limit setpoint for the integrated circuit responsive to the current; and
operating the output pin in a second mode of operation after the determination of the current limit setpoint, wherein the output pin comprises an open drain output.

13. The method of claim 12, wherein the step of determining further comprises the step of multiplying the current by a preselected value to establish the current limit setpoint for the integrated circuit.

14. The method of claim 12 further including the step of storing the current limit setpoint for the integrated circuit.

15. The method of claim 12, wherein the output pin comprises a fault pin.

16. The method of claim 12, wherein the step of measuring further includes the step of measuring the current without placing the predetermined non-reference voltage at the output pin below a predetermined threshold voltage level.

17. The method of claim 12, wherein step of measuring further comprises the step of measuring the current in a start-up mode of the integrated circuit.

18. The method of claim 12, wherein the step of operating further includes the step of operating as an open-drain driver at the output pin in the second mode of operation.

19. An integrated circuit, comprising:
a pin coupled to an output of the integrated circuit;
current measurement circuitry for applying a predetermined voltage from within the integrated circuit and through the pin, wherein the predetermined voltage is not equal to a reference voltage, and measuring a current through the pin responsive to the predetermined voltage in a start-up mode of operation, wherein the current enables setting of a current limit setpoint for the integrated circuit; and
wherein in a second mode of operation the pin comprises an open drain output, the current measurement circuitry including:
a first amplifier circuit coupled to a reference voltage and generating the predetermined voltage in response to the reference voltage; and
a second amplifier circuit coupled to the pin and the first amplifier circuit and generating the current through the pin by forcing a voltage on the pin to be substantially equal with the predetermined voltage.

20. The integrated circuit of claim 19, wherein the pin comprises a fault output pin of the integrated circuit.

* * * * *

UNITED STATES PATENT AND TRADEMARK OFFICE
CERTIFICATE OF CORRECTION

| | | |
|---|---|---|
| PATENT NO. | : 8,836,352 B2 | Page 1 of 1 |
| APPLICATION NO. | : 12/482527 | |
| DATED | : September 16, 2014 | |
| INVENTOR(S) | : Shearon et al. | |

It is certified that error appears in the above-identified patent and that said Letters Patent is hereby corrected as shown below:

In the Claims

Column 4, Line 17, Claim 1 remove "An integrated circuit, comprising:"
Column 6, Line 7, Claim 16 replace "predetermined non-reference voltage" with --predetermined voltage--

Signed and Sealed this
Second Day of December, 2014

Michelle K. Lee
*Deputy Director of the United States Patent and Trademark Office*